US012581571B2

(12) United States Patent

Hu et al.

(10) Patent No.: US 12,581,571 B2

(45) Date of Patent: Mar. 17, 2026

(54) SYSTEM AND METHODS FOR A RADIANT HEAT CAP IN A SEMICONDUCTOR WAFER REACTOR

(71) Applicant: GlobalWafers Co., Ltd., Hsinchu (TW)

(72) Inventors: Chieh Hu, Chiayi (TW); Chun-Chin Tu, Zhubei City (TW); Lunghsing Hsu, Hsinchu City (TW)

(73) Assignee: GlobalWafers Co., Ltd., Hsinchu (TW)

( * ) Notice: Subject to any disclaimer, the term of this patent is extended or adjusted under 35 U.S.C. 154(b) by 1121 days.

(21) Appl. No.: 17/139,387

(22) Filed: Dec. 31, 2020

(65) Prior Publication Data

US 2022/0210872 A1 Jun. 30, 2022

(51) Int. Cl.
*H05B 3/00* (2006.01)
*H01L 21/263* (2006.01)

(52) U.S. Cl.
CPC ....... *H05B 3/0047* (2013.01); *H01L 21/2636* (2013.01)

(58) Field of Classification Search
None
See application file for complete search history.

(56) References Cited

U.S. PATENT DOCUMENTS 5,791,782 A * 8/1998 Wooten .................. G01K 1/143
374/E1.019
5,820,686 A 10/1998 Moore 6,198,805 B1 3/2001 Jambunathan et al.
6,213,478 B1 * 4/2001 Nishikawa ........ H01L 21/68792
118/503
6,325,858 B1 * 12/2001 Wengert .............. C23C 16/4401
118/724

(Continued)

FOREIGN PATENT DOCUMENTS

CN 111304740 A 6/2020
JP 2006336069 A 6/2005

(Continued)

OTHER PUBLICATIONS

"A Comprehensive Guide to Infrared Thermometers" Source: https://uk.rs-online.com/web/content/discovery/ideas-and-advice/infrared-thermometers-guide Printed on Jul. 11, 2025 (Year: 2025).*

(Continued)

*Primary Examiner* — Parviz Hassanzadeh
*Assistant Examiner* — Tiffany Z Nuckols
(74) *Attorney, Agent, or Firm* — Armstrong Teasdale LLP

(57) ABSTRACT

A reaction apparatus contacts a process gas on a semiconductor wafer during a wafering process. The semiconductor wafer defines a center region. The reaction apparatus includes an upper dome, a lower dome, a shaft, and a cap. The lower dome is attached to the upper dome, and the upper dome and the lower dome define a reaction chamber. The cap is positioned on the shaft within the reaction chamber for reducing heat absorbed by the center region of the semiconductor wafer. The cap is attached to a first end of the shaft. The cap includes a tube and a disc. The tube defines a tube diameter larger than a shaft diameter of the shaft. The tube circumscribes the first end of the shaft. The disc is attached to the tube and is positioned to block radiant heat from heating the center region of the semiconductor wafer.

8 Claims, 8 Drawing Sheets

(56) References Cited

U.S. PATENT DOCUMENTS

| | | | |
|---|---|---|---|
| 6,375,749 B1 * | 4/2002 | Boydston | H01L 21/68785 |
| | | | 118/728 |
| 8,372,298 B2 | 2/2013 | Haberecht | |
| 9,401,271 B2 | 7/2016 | Pitney et al. | |
| 9,905,444 B2 | 2/2018 | Ranish | |
| 2002/0011211 A1 * | 1/2002 | Halpin | C23C 16/4404 |
| | | | 118/715 |
| 2002/0043337 A1 * | 4/2002 | Goodman | H01L 21/68728 |
| | | | 156/345.12 |
| 2007/0232083 A1 | 10/2007 | Itani | |
| 2010/0112213 A1 * | 5/2010 | Nakamura | C30B 25/12 |
| | | | 118/725 |
| 2013/0276695 A1 * | 10/2013 | Pitney | H01L 21/68785 |
| | | | 118/728 |
| 2014/0263268 A1 * | 9/2014 | Cong | H05B 1/0227 |
| | | | 219/443.1 |
| 2016/0282886 A1 * | 9/2016 | Leighton | G05D 23/1919 |
| 2017/0213759 A1 * | 7/2017 | Ma | H01L 21/67115 |
| 2019/0110336 A1 | 4/2019 | Cong et al. | |
| 2019/0371631 A1 * | 12/2019 | Lau | B23K 26/0823 |
| 2020/0045776 A1 * | 2/2020 | Huang | H05B 3/0047 |

FOREIGN PATENT DOCUMENTS

| | | |
|---|---|---|
| JP | 2005260095 A | 9/2005 |
| JP | 2010114138 A | 5/2010 |
| JP | 2010114331 A | 5/2010 |
| JP | 2015082634 A | 4/2015 |
| JP | 2015516685 A | 6/2015 |
| JP | 2016519208 A | 6/2016 |
| KR | 20190098430 A | 8/2019 |
| WO | 0026946 A1 | 5/2000 |
| WO | 2017137872 A1 | 8/2017 |

OTHER PUBLICATIONS

International Search Report and Written Opinion issued for PCT/US2021/065665, dated Apr. 20, 2022 (14 pages).

* cited by examiner

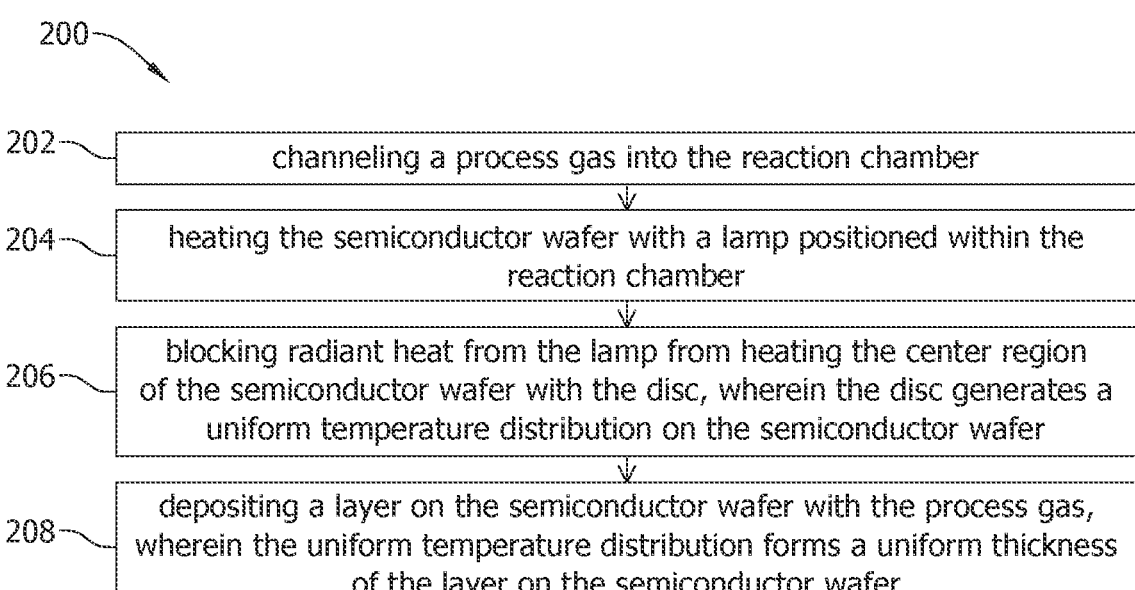

200

202 — channeling a process gas into the reaction chamber

204 — heating the semiconductor wafer with a lamp positioned within the reaction chamber 206 — blocking radiant heat from the lamp from heating the center region of the semiconductor wafer with the disc, wherein the disc generates a uniform temperature distribution on the semiconductor wafer 208 — depositing a layer on the semiconductor wafer with the process gas, wherein the uniform temperature distribution forms a uniform thickness of the layer on the semiconductor wafer

FIG. 11

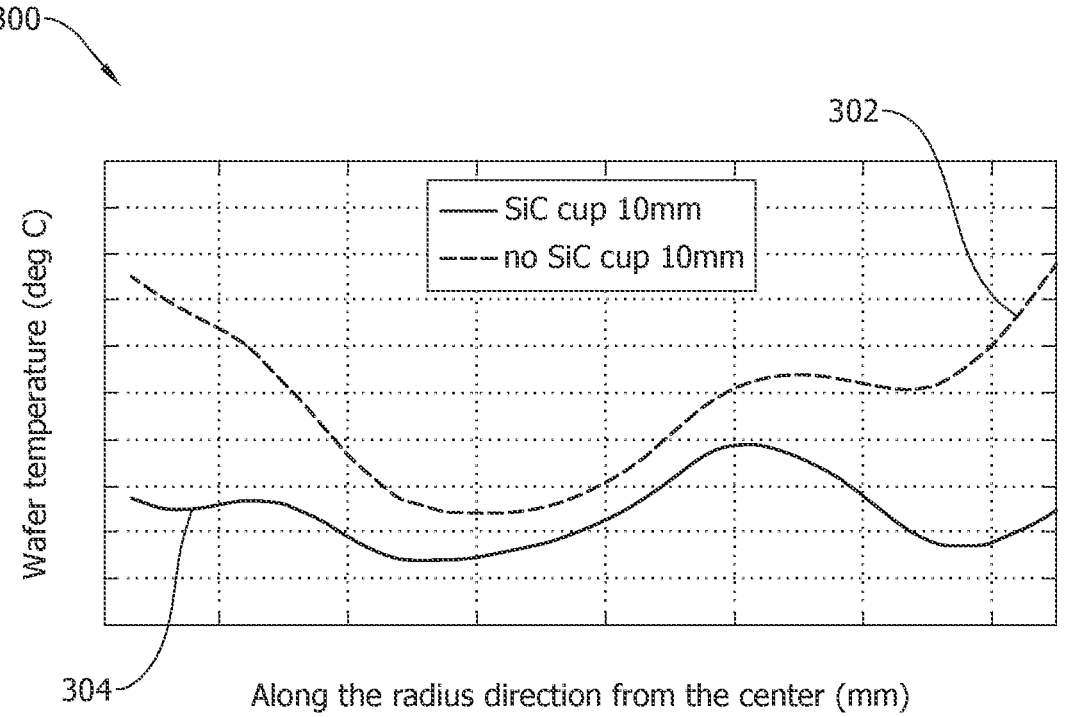

300

302

Wafer temperature (deg C)

——— SiC cup 10mm
--- no SiC cup 10mm

304

Along the radius direction from the center (mm)

FIG. 12

SYSTEM AND METHODS FOR A RADIANT HEAT CAP IN A SEMICONDUCTOR WAFER REACTOR

FIELD

The field relates generally to apparatus and methods for wafer processing, and more particularly to apparatus and methods for semiconductor wafer etching or semiconductor wafer chemical vapor deposition processes.

BACKGROUND

Epitaxial chemical vapor deposition (CVD) is a process for growing a thin layer of material on a semiconductor wafer so that the lattice structure is identical to that of the wafer. Epitaxial CVD is widely used in semiconductor wafer production to build up epitaxial layers such that devices can be fabricated directly on the epitaxial layer. The epitaxial deposition process begins by introducing a cleaning gas, such as hydrogen or a hydrogen and hydrogen chloride mixture, to a front surface of the wafer (i.e., a surface facing away from the susceptor) to pre-heat and clean the front surface of the wafer. The cleaning gas removes native oxide from the front surface, permitting the epitaxial silicon layer to grow continuously and evenly on the surface during a subsequent step of the deposition process. The epitaxial deposition process continues by introducing a vaporous silicon source gas, such as silane or a chlorinated silane, to the front surface of the wafer to deposit and grow an epitaxial layer of silicon on the front surface. A back surface opposite the front surface of the susceptor may be simultaneously subjected to hydrogen gas. The susceptor, which supports the semiconductor wafer in the deposition chamber during the epitaxial deposition, is rotated during the process to allow the epitaxial layer to grow evenly.

However, epitaxial CVD growth rates are generally not uniform across the surface of each wafer because of a non-uniform temperature profile of the semiconductor wafer. A lack of uniformity causes degradation in the flatness of the wafer and may be a result of variability or local temperature deviations within the semiconductor wafer caused by non-uniform heating of the semiconductor wafer by high intensity lamps. Accordingly, there exists a need for a practical, cost-effective apparatus to improve local temperature deviations to improve uniformity of epitaxial CVD growth rates.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

In one aspect, a reaction apparatus for contacting a process gas on a semiconductor wafer during a wafering process is provided. The semiconductor wafer defines a center region. The reaction apparatus includes an upper dome, a lower dome, a shaft, and a cap. The lower dome is attached to the upper dome, and the upper dome and the lower dome define a reaction chamber. The shaft supports the semiconductor wafer within the reaction chamber. The cap is positioned on the shaft within the reaction chamber for reducing heat absorbed by the center region of the semiconductor wafer. The cap is attached to a first end of the shaft. The cap includes a tube and a disc. The tube defines a tube diameter larger than a shaft diameter of the shaft. The tube circumscribes the first end of the shaft. The disc is attached to the tube and is positioned to block radiant heat from heating the center region of the semiconductor wafer.

In another aspect, a cap positioned on a shaft of a reaction apparatus for reducing heat absorbed by a center region of a semiconductor wafer during a wafering process is provided. The cap includes a tube and a disc. The tube defines a tube diameter larger than a shaft diameter of the shaft. The tube circumscribes a first end of the shaft. The disc is attached to the tube and blocks radiant heat from heating the center region of the semiconductor wafer.

In yet another aspect, a method of manufacturing a semiconductor wafer in a reaction apparatus is provided. The reaction apparatus includes an upper dome and a lower dome defining a reaction chamber and a shaft for supporting the semiconductor wafer. The reaction apparatus further includes a cap positioned on the shaft within the reaction chamber for reducing heat absorbed by a center region of the semiconductor wafer. The cap includes a tube and a disc attached to the tube. The method includes channeling a process gas into the reaction chamber. The method also includes heating the semiconductor wafer with a high intensity lamp positioned within the reaction chamber. The method further includes blocking radiant heat from the high intensity lamp from heating the center region of the semiconductor wafer with the disc. The disc generates a uniform temperature distribution on the semiconductor wafer. The method also includes depositing a layer on the semiconductor wafer with the process gas. The uniform temperature distribution forms a uniform thickness of the layer on the semiconductor wafer.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

FIG. 11 is a flow diagram of a method of manufacturing a semiconductor wafer in the reaction apparatus shown in FIG. 1.

FIG. 12 is a graph of epitaxial wafer radial temperature as a function of wafer radial distance in accordance with Example 1.

Corresponding reference characters indicate corresponding parts throughout the drawings.

DETAILED DESCRIPTION

Figure 1:
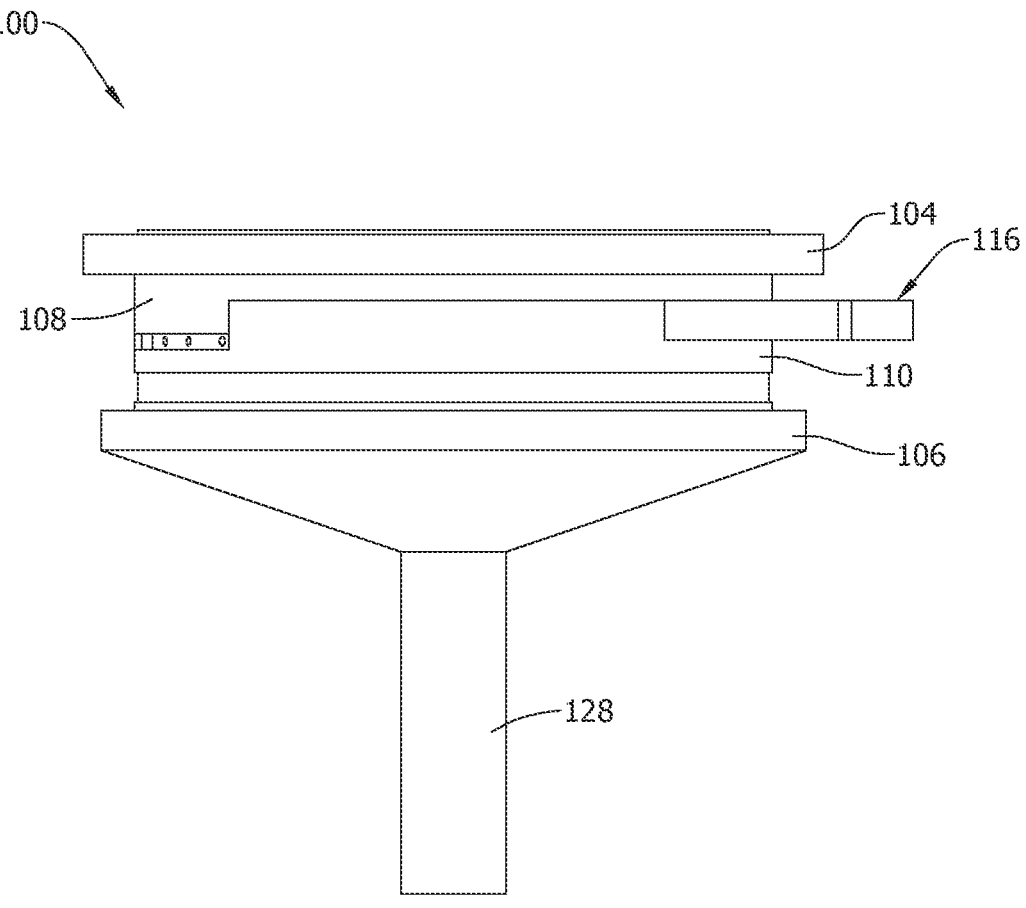
FIG. 1 is a front view of an apparatus for processing a substrate such as a semiconductor wafer.
Figure 2:
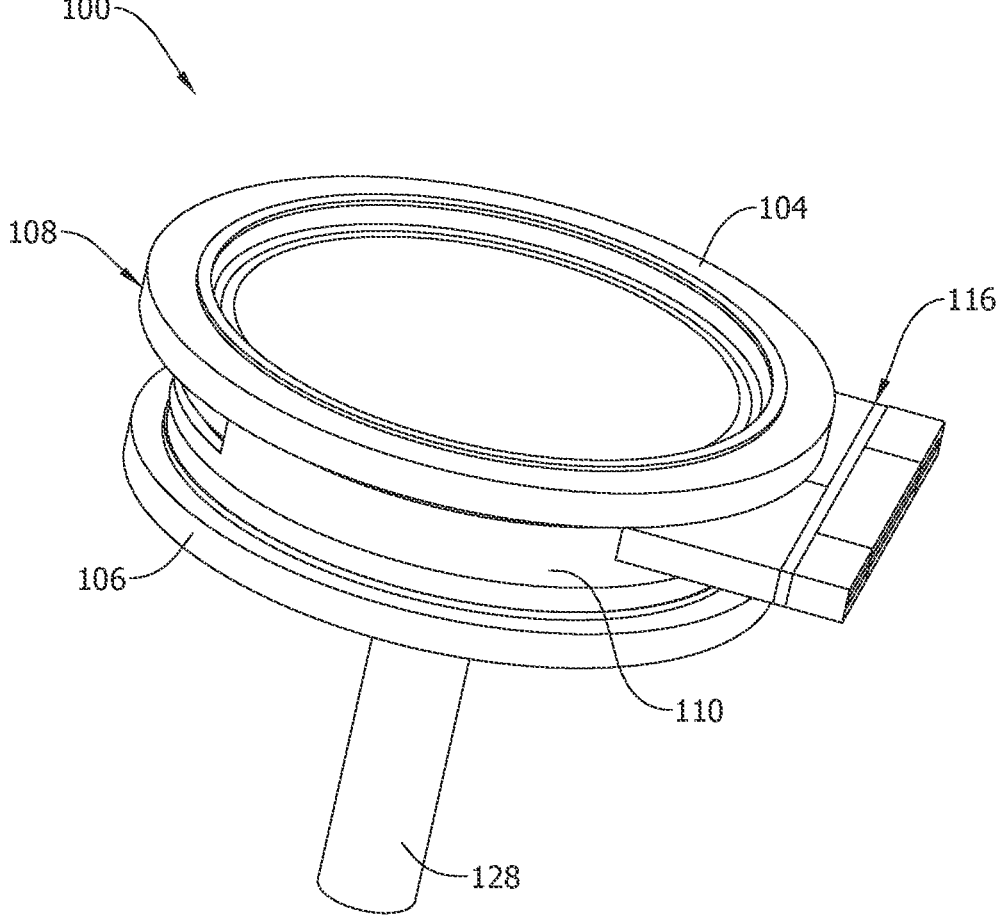
FIG. 2 is a perspective view of the apparatus shown in FIG. 1.

Referring now to FIG. 1, an apparatus for etching a semiconductor wafer or for depositing an epitaxial layer on a semiconductor substrate in accordance with an embodiment of the present disclosure is generally referred to as 100. The illustrated apparatus is a single wafer reactor; however, the apparatus and methods disclosed herein for providing a more uniform epitaxial layer are suitable for use in other reactor designs including, for example, multiple wafer reactors. The apparatus 100 includes a reaction chamber 102 comprising an upper dome 104, a lower dome 106, an upper liner 108, and a lower liner 110. Collectively, the upper dome 104, lower dome 106, upper liner 108, and lower liner 110 define an interior space 112 of the reaction chamber 102 in which process gas contacts a semiconductor wafer 114. A gas manifold 116 is used to direct process gas into the reaction chamber 102. A perspective view of the reaction chamber 102 and gas manifold 116 is shown in FIG. 2.

The apparatus 100 may be used to process a wafer in a wafering process, including without limitation, depositing any type of material on a wafer performed by a chemical vapor deposition (CVD) process, such as epitaxial CVD or polycrystalline CVD. In this regard, reference herein to epitaxy and/or CVD processes should not be considered limiting as the apparatus 100 may also be used for other purposes such as to perform etching or smoothing processes on the wafer. Also, the wafer shown herein is generally circular in shape, though wafers of other shapes are contemplated within the scope of this disclosure.

Figure 3:
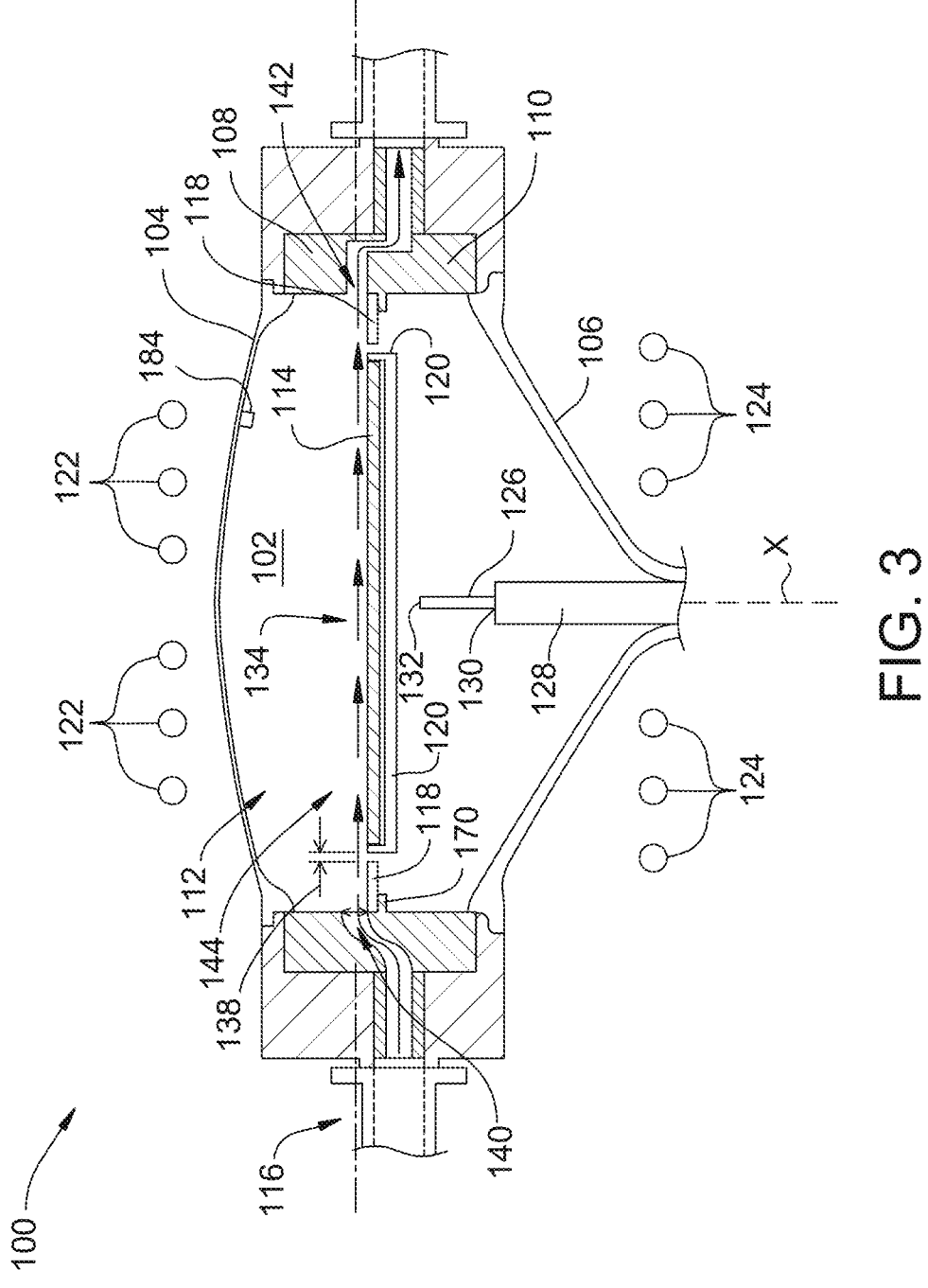
FIG. 3 is a cross sectional view of the apparatus shown in FIG. 1.

A cross section of the apparatus 100 is shown in FIG. 3. Within the interior space 112 of the reaction chamber 102 is a preheat ring 118 for heating the process gas prior to contact with a semiconductor wafer 114. The outside circumference of the preheat ring 118 is attached to the inner circumference of the lower liner 110. For example, the preheat ring 118 may be supported by an annular ledge (not shown) of the lower liner 110. A susceptor 120 (which may also be referred to herein as a "susceptor body") traversing the space interior to the preheat ring 118 supports the semiconductor wafer 114.

Process gas may be heated prior to contacting the semiconductor wafer 114. Both the preheat ring 118 and the susceptor 120 are generally opaque to absorb radiant heating light produced by high intensity lamps 122, 124 that may be located above and below the reaction chamber 102 for heating the semiconductor wafer 114. Maintaining the preheat ring 118 and the susceptor 120 at a temperature above ambient allows the preheat ring 118 and the susceptor 120 to transfer heat to the process gas as the process gas passes over the preheat ring and the susceptor. Typically, the diameter of the semiconductor wafer 114 is less than the diameter of the susceptor 120 to allow the susceptor to heat the process gas before it contacts the wafer.

The preheat ring 118 and susceptor 120 may suitably be constructed of opaque graphite coated with silicon carbide, though other materials are contemplated. The upper dome 104 and lower dome 106 are typically made of a transparent material to allow radiant heating light to pass into the reaction chamber 102 and onto the preheat ring 118 and the susceptor 120. The upper dome 104 and lower dome 106 may be constructed of transparent quartz. Quartz is generally transparent to infrared and visible light and is chemically stable under the reaction conditions of the deposition reaction. Equipment other than high intensity lamps 122, 124 may be used to provide heat to the reaction chamber such as, for example, resistance heaters and inductive heaters. An infrared temperature sensor 184 such as a pyrometer may be mounted on the reaction chamber 102 to monitor the temperature of the susceptor 120, preheat ring 118, or semiconductor wafer 114 by receiving infrared radiation emitted by the susceptor, preheat ring, or wafer.

Figure 4:
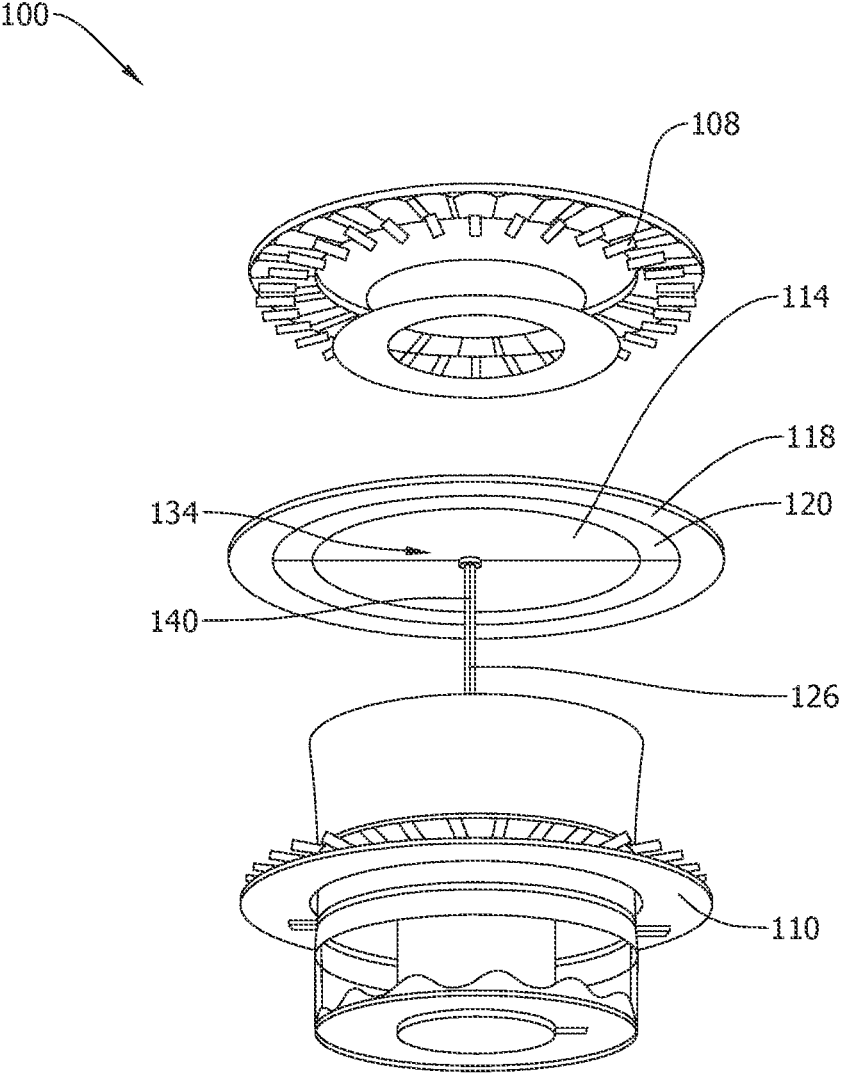
FIG. 4 is an exploded perspective view of the apparatus shown in FIG. 1.
Figure 5:
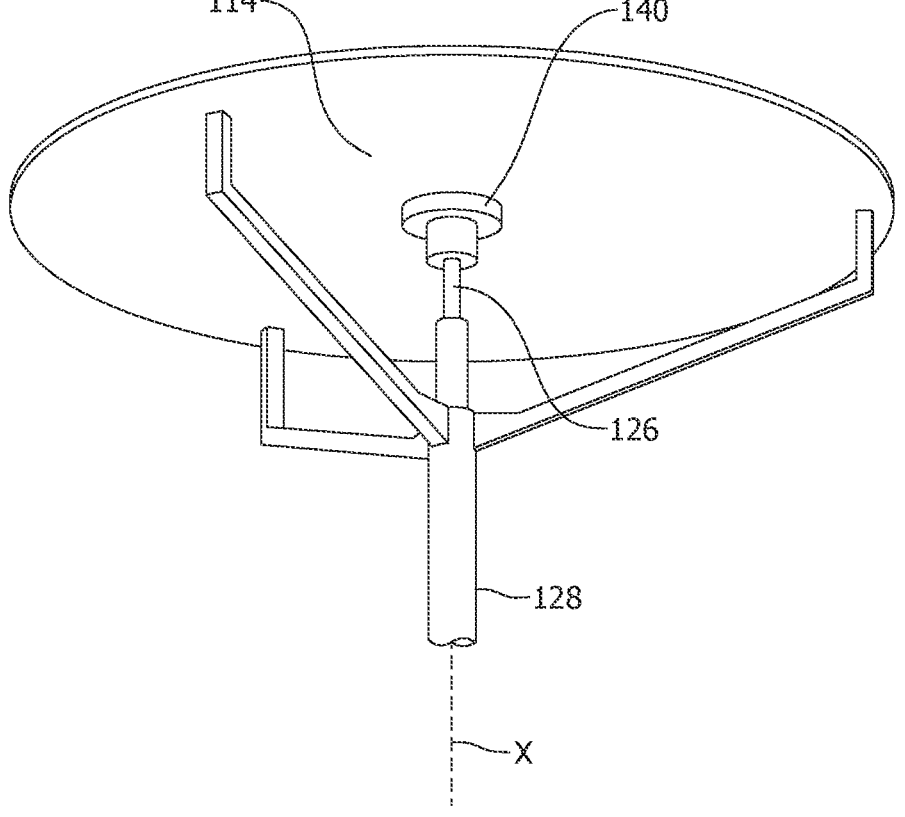
FIG. 5 is a perspective view of a cap positioned on a shaft shown in FIG. 3.
Figure 6:
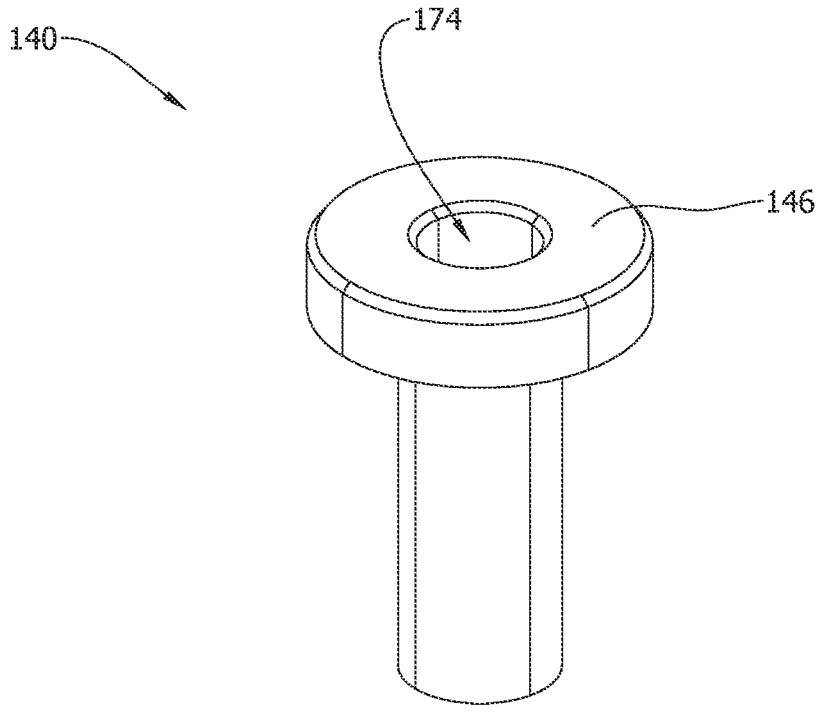
FIG. 6 is a perspective view of the cap shown in FIGS. 3-5.
Figure 7:
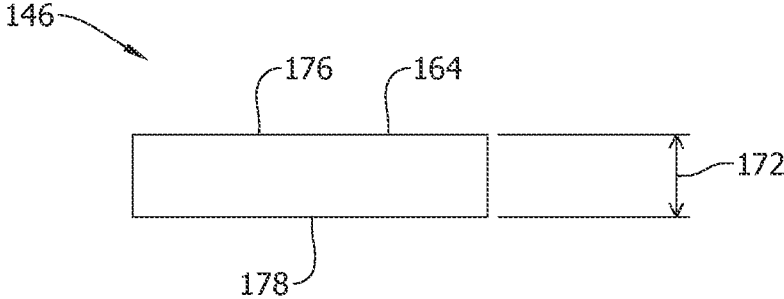
FIG. 7 is a side view of the disc shown in FIG. 6.

Referring now to FIGS. 3-5, wherein some components of the apparatus 100 are removed to better illustrate the apparatus, the apparatus 100 includes a shaft 126 that may support the susceptor 120. The shaft 126 extends through a central column 128. The shaft 126 includes a second end 130 attached to the central column 128 and a first end 132 positioned proximate a center region 134 of the semiconductor wafer 114. The shaft 126 has a shaft diameter 136 of about 5 millimeters (mm) to about 20 mm.

The shaft 126 is connected to a suitable rotation mechanism (not shown) for rotation of the shaft 126, susceptor 120, and semiconductor wafer 114 about a longitudinal axis X with respect to the apparatus 100. The outside edge of the susceptor 120 and inside edge of the preheat ring 118 (shown in FIG. 3) are separated by a gap 138 to allow rotation of the susceptor. The semiconductor wafer 114 is rotated to prevent an excess of material from being deposited on the wafer leading edge and provide a more uniform epitaxial layer.

The apparatus 100 also includes a cap 140 positioned on the shaft 126 within the reaction chamber 102 for reducing heat absorbed by the center region 134 of the semiconductor wafer 114. The cap 140 is attached to the first end 132 of the shaft 126 proximate the center region 134 of the semiconductor wafer 114 to block radiant heat from the lower high intensity lamp 124 from heating the center region of the semiconductor wafer. Reducing radiant heat to the center region 134 of the semiconductor wafer 114 reduces a temperature of the center region while maintaining a temperature of outer radial regions 142 of the semiconductor wafer 114, generating a uniform temperature profile of the semiconductor wafer.

Figure 10:
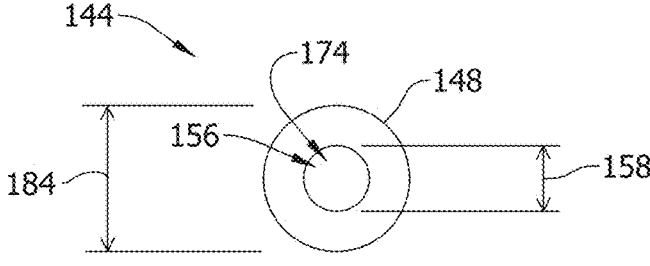
FIG. 10 is a top view of the tube shown in FIG. 6.

The cap 140 includes a tube 144 and a disc 146 attached to the tube. In the illustrated embodiment, the tube 144 and the disc 146 are integrally formed together such that the cap 140 has a unitary construction. In alternative embodiments, the tube 144 and the disc 146 may be formed separately and attached to each other. The tube 144 includes a cylindrical wall 148 having a first end 150, a second end 152, and a tube length 154 and defining a tube conduit 156. The tube 144 has a tube outer diameter 184 (FIG. 10) and a tube inner diameter 158 (hereinafter referred to more simply as "tube diameter 158"). The first end 150 defines a first end opening 160, and the second end 152 defines a second end opening 162. The tube diameter 158 is larger than the shaft diameter 136 such that the first end 132 of the shaft 126 is inserted into the first end opening 160 and the first end 150 circumscribes the first end of the shaft. The second end 152 is attached to the disc 146.

The disc 146 includes an annular disc 164 defining a disc hole 166, an inner diameter 168, an outer diameter 170, and a disc thickness 172. The tube diameter 158 and the inner diameter 168 are the same, or substantially equal, such that the cylindrical wall 148 is substantially flush with the disc hole 166 and the tube conduit 156 and the disc hole define a cap conduit 174 extending through the cap 140. In alternative embodiments, the tube diameter 158 is larger than the inner diameter 168, and the tube conduit 156 and the disc hole 166 define the cap conduit 174.

The annular disc 164 has a first side 176 and a second side 178, and the first side of the annular disc is attached to the second end 152 of the tube 144. The first side 176 of the annular disc 164 is oriented toward the lower high intensity lamp 124, and the second side 178 is oriented toward the center region 134 of the semiconductor wafer 114. The annular disc 164 may be attached to the tube 144 in any suitable manner. Additionally, the annular disc 164 may have other shapes, one or more recesses formed therein, and/or several openings formed therein.

The outer diameter 170 is larger than the tube diameter 158 and the inner diameter 168 such that the annular disc 164 blocks radiant heat from the lower high intensity lamp 124 from heating the center region of the semiconductor wafer. The annular disc 164 extends from the disc hole 166 and the cylindrical wall 148 such that the annular disc extends a blocking distance 180 from the cylindrical wall and the disc hole. The blocking distance 180 is configured to block a predetermined amount of radiant heat to generate the uniform temperature profile of the semiconductor wafer 114.

The cap 140 is suitably made of an opaque material to block visible and infrared light from being transmitted to the center region 134 of the semiconductor wafer 114. In other embodiments, rather than being opaque, the cap 140 may be made of a translucent material to provide local cooling to the semiconductor wafer 114 and decrease any local or global maximum epitaxial layer thickness, generating a uniform thickness profile of the epitaxial layer and/or the semiconductor wafer 114.

Generally, the cap 140 corrects and/or affects the radial temperature profile of the semiconductor wafer 114 during processing, such as epitaxial deposition to alleviate non-uniformities. The cap 140 may cause the temperature of the center region 134 of the semiconductor wafer 114 above the cap to decrease (relative to when a cap is not used) thereby decreasing the amount of material (e.g., silicon) that deposits in the center region of the semiconductor wafer during epitaxial CVD processes. Accordingly, the cap 140 is suitably positioned a distance below the center region 134 of the semiconductor wafer 114 in which a localized or global maximum layer thickness occurs to decrease the deposition at the central region and create a more uniform radial deposition profile. Note that this maximum layer thickness may be a local or global maximum, and may generally be referred to as a non-uniformity. For example, the cap 140 (or the disc 164 of the cap 140) may be positioned a distance of less than about 5 mm below the center region 134 of the semiconductor wafer 114.

The thickness profile may be determined by use of any suitable method available to those of skill in the art including, for example, use of a Fourier-Transform Infrared (FTIR) spectrometer or use of a wafer flatness tool (e.g., KLA-Tencor Wafersight or WaferSight2; Milpitas, Calif.). In some embodiments, the radial thickness profile of the substrate is determined before material deposition (e.g., before deposition of an epitaxial layer) and the thickness profile of the layered structure may then be measured. The thickness profile of the deposited layer may be determined by subtracting the substrate thickness from the layered structure thickness.

Specifically, in the illustrated embodiment, the tube length 154 is about 10 mm to about 30 mm; the tube diameter 158 is about 5 mm to about 20 mm; the inner diameter 168 is about 5 mm to about 20 mm; the outer diameter 170 is about 10 mm to about 40 mm; the disc thickness 172 is about 3 mm to about 10 mm; and the blocking distance 180 is about 5 mm to about 35 mm. In alternative embodiments, the shaft diameter 136, the tube length 154, the tube diameter 158, the inner diameter 168, the outer diameter 170, the disc thickness 172, and the blocking distance 180 may be any distance that enables the cap 140 to operate as described herein. More specifically, the shaft diameter 136, the tube length 154, the tube diameter 158, the inner diameter 168, the outer diameter 170, the disc thickness 172, and the blocking distance 180 are suitably chosen depending on a location and size of a local or global epitaxial layer thickness minimum or maximum.

A distance 182 between the cap 140 and the susceptor 120 that is less than about 40 mm, less than about 20 mm, or even less than about 1 mm. Decreasing the distance 182 between the cap 140 and the susceptor 120 generally results in deposition of more material on the wafer in portions of the wafer above the ring and increasing the distance generally results in less deposition. Therefore, the amount of material deposited on portions of the wafer above the cap 140 may be adjusted by varying this distance.

Figure 8:
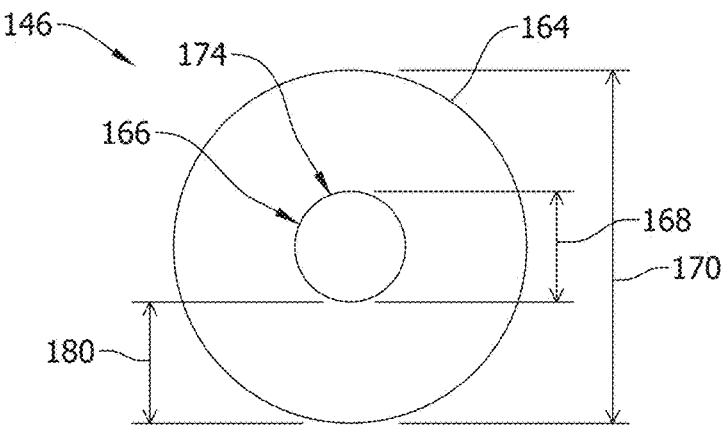
FIG. 8 is a top view of the disc shown in FIG. 6.
Figure 9:
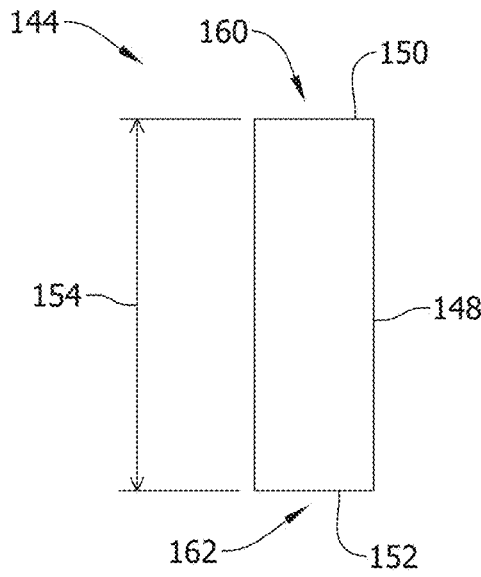
FIG. 9 is a side view of the tube shown in FIG. 6.

The ranges recited above for the shaft diameter 136, the tube length 154, the tube diameter 158, the inner diameter 168, the outer diameter 170, the disc thickness 172, the blocking distance 180, the distance 182, and the like are exemplary and values outside of the stated ranges may be used without limitation. As shown in FIG. 8, the disc 146 has a substantially uniform circular shape. In other embodiments, the disc 146 may be shaped to include various projections and/or notches or recesses. The disc 146 may also be beveled or rounded. Such non-uniform shapes may enable the disc 146 to block radiant heat from the lower high intensity lamp 124 from heating regions out the center region 134 of the semiconductor wafer 114. For example, analysis of the temperature profile of the semiconductor wafer 114 may identify regions outside of the center region 134 that have elevated temperatures such that the deposition of material in those areas is non-uniform. The shape of the disc 146 may be adjusted to block radiant heat from the lower high intensity lamp 124 from heating those regions to decrease material deposition within those regions.

FIG. 11 is a flow diagram of a method 200 of manufacturing a semiconductor wafer in a reaction apparatus. The method 200 includes channeling 202 a process gas into the reaction chamber. The method 200 also includes heating 204 the semiconductor wafer with a high intensity lamp positioned within the reaction chamber. The method 200 further includes blocking 206 radiant heat from the high intensity lamp from heating the center region of the semiconductor wafer with the disc. The disc generates a uniform temperature distribution on the semiconductor wafer. The method 200 also includes depositing 208 a layer on the semiconductor wafer with the process gas. The uniform temperature distribution forms a uniform thickness of the layer on the semiconductor wafer.

EXAMPLES

The processes of the present disclosure are further illustrated by the following Example. This Example should not be viewed in a limiting sense.

Example 1: Determining the Effect of Using a Cap on the Radial Temperature Profile of the Semiconductor Wafer An opaque cap as described herein was tested in a single wafer epitaxy reactor to determine their effect on the epitaxial wafer temperature profile. The epitaxial wafers were prepared by exposing single crystal silicon wafer produced by the Czochralski method to a process gas at a wafer temperature between 1050° C. to 1150° C. The disc of the cap had an outer diameter of 10 mm.

A control run was performed in which a cap was not used. FIG. 12 is a graph 300 of epitaxial wafer radial temperature as a function of wafer radial distance. As can be seen from FIG. 12, the control resulted in a non-uniform epitaxial wafer radial temperature profile 302, and the cap resulted in a uniform epitaxial wafer radial temperature profile 304. The uniform epitaxial wafer radial temperature profile 304 is more uniform because the local temperature maximums at the ends of the profile are less than the local temperature maximums at the ends of the non-uniform epitaxial wafer radial temperature profile 302. Accordingly, the cap generated a uniform temperature profile of the epitaxial wafer.

Compared to conventional methods for producing silicon wafers, the systems and methods of the present disclosure have several advantages. For example, reactors that include caps as described facilitate cost-effective manufacture of semiconductor wafers with a uniform temperature profile during deposition. The uniform temperature profile generates a more uniform deposition thickness profile. Thus, the caps enable production of a semiconductor wafer with a uniform thickness profile. An example cap has a disc in or around a center region of the wafer and blocks radiant heat from heating the center region of the wafer. The temperature of the center region is thereby reduced, generating a uniform temperature profile and a uniform thickness profile. Accordingly, the example caps eliminate or reduce local temperature deviations, as compared to the prior art, to improve the uniformity of epitaxial CVD growth on a wafer. Additionally, use of the above examples can improve the production rate of the epitaxial CVD system, and can lower operational costs by reducing waste.

When introducing elements of the present invention or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. A reaction apparatus for contacting a process gas on a semiconductor wafer during a wafering process, the semiconductor wafer defining a center region, the reaction apparatus comprising:
an upper dome;
a lower dome attached to the upper dome, the upper dome and the lower dome defining a reaction chamber;

a susceptor for supporting the semiconductor wafer within the reaction chamber, wherein the susceptor is supported by a shaft;
a cap positioned on the shaft within the reaction chamber for reducing heat absorbed by the center region of the semiconductor wafer, the cap attached to a first end of the shaft, the cap comprising:
a tube defining a tube outer diameter and a tube inner diameter larger than a shaft diameter of the shaft, wherein the tube circumscribes the first end of the shaft; and
a disc attached to the tube, the disc defining a disc outer diameter, the disc outer diameter being greater than the tube outer diameter, wherein the disc is generally opaque to absorb radiant heat and is positioned to block the radiant heat from heating the center region of the semiconductor wafer, wherein the disc is positioned a distance below the center region of the semiconductor wafer and the susceptor; and
a temperature sensor mounted on the reaction chamber, the temperature sensor being separate from the cap, the cap being free of temperature sensors.

2. The reaction apparatus of claim 1 further comprising a lower high intensity lamp positioned below the cap within the reaction chamber for heating the semiconductor wafer, wherein the disc blocks radiant heat from the lower high intensity lamp from heating the center region of the semiconductor wafer.

3. The reaction apparatus of claim 1, wherein the wafering process is epitaxial chemical vapor deposition.

4. The reaction apparatus of claim 1, wherein the disc includes an annular disc defining a disc hole, the disc hole having a diameter, the disc outer diameter being larger than the diameter of the disc hole.

5. The reaction apparatus of claim 4, wherein the inner tube diameter is substantially equal to the diameter of the disc hole.

6. The reaction apparatus of claim 1, wherein the disc is positioned below the center region of the semiconductor wafer a distance less than about 5 millimeters.

7. A reaction apparatus for contacting a process gas on a semiconductor wafer during a wafering process, the semiconductor wafer defining a center region, the reaction apparatus comprising:
an upper dome;
a lower dome attached to the upper dome, the upper dome and the lower dome defining a reaction chamber;
a susceptor for supporting the semiconductor wafer within the reaction chamber, wherein the susceptor is supported by a shaft;
a cap positioned on the shaft within the reaction chamber, wherein the cap is made of an opaque material and is positioned to block radiant heat from heating the center region of the semiconductor wafer, wherein the cap is positioned a distance below the center region of the semiconductor wafer and the susceptor to decrease deposition of the process gas at the center region, wherein the cap extends radially outward from the shaft, the cap comprising:
a tube defining a tube outer diameter and a tube inner diameter larger than a shaft diameter of the shaft; and
a disc attached to the tube, the disc defining a disc outer diameter, the disc outer diameter being greater than the tube outer diameter; and
a temperature sensor mounted on the reaction chamber, the temperature sensor being separate from the cap, the cap being free of temperature sensors.

8. The reaction apparatus of claim 7 further comprising a lower high intensity lamp positioned below the cap for heating the semiconductor wafer, wherein the cap absorbs radiant heat from the lower high intensity lamp.

* * * * *